Figure 1:
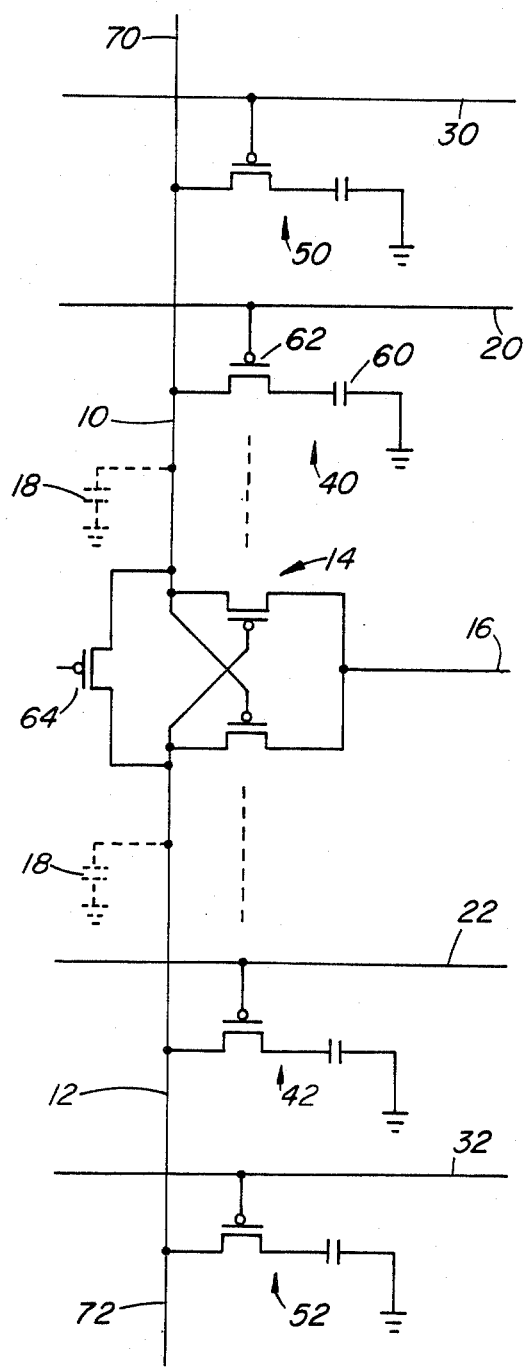

United States Patent [19]

Penchuk

[11] Patent Number: 4,581,719

[45] Date of Patent: Apr. 8, 1986

[54] DYNAMIC MOS MEMORY REFERENCE VOLTAGE GENERATOR

[75] Inventor: Robert A. Penchuk, Nepean, Canada

[73] Assignee: Northern Telecom Limited, Montreal, Canada

[21] Appl. No.: 737,748

[22] Filed: May 28, 1985

[51] Int. Cl.$^4$ .............................................. G11C 13/00
[52] U.S. Cl. .................................... 365/203; 365/227; 307/246
[58] Field of Search .................... 320/1; 365/203, 149, 365/189, 226, 227; 307/246, 530, 296 R, 353

[56] References Cited

U.S. PATENT DOCUMENTS 4,504,929  3/1985  Takemae et al. .................... 307/530

Primary Examiner—Terrell W. Fears
Attorney, Agent, or Firm—R. John Haley

[57] ABSTRACT

In a dynamic MOS memory, e.g. a RAM, the charge on the capacitor of a reference cell is restored following a read or refresh operation by coupling a reference voltage generator to the RAM bit line. The generator produces the reference voltage at the output of a buffer whose input is coupled to two capacitors after these have been charged to different voltages and their charges shared. The arrangement allows for transistor thresholds without requiring bootstrapping, is insensitive to manufacturing process variations in that all of the capacitors can be similar, provides for enhanced operation speed, and provides for qualitative signal margin analysis.

14 Claims, 2 Drawing Figures

DYNAMIC MOS MEMORY REFERENCE VOLTAGE GENERATOR

This invention relates to dynamic MOS memories, e.g. RAMs (random access memories), and is particularly concerned with a reference voltage generator for such memories.

In the read and refresh operation cycles of a dynamic RAM, the charge on a memory cell capacitor, representing one bit (binary digit) of the memory which may be 0 or 1, is effectively compared with the charge on a reference cell capacitor to determine whether the bit is 0 or 1. For the best signal margin, i.e. discrimination between the 0 and 1 charge states, the reference cell capacitor is desirably charged to a voltage which is mid-way between the voltages of the memory cell capacitor representing the 0 and 1 bits. After each read or refresh operation, the charge on the reference cell capacitors must be restored.

In one known manner of restoring the charge on the reference cell capacitors, one of the two bit lines, to which two similar reference cell capacitors are connected, is charged to a supply voltage while the other is discharged to zero voltage. The two bit lines are then coupled together to share the charge equally therebetween, so that each reference cell capacitor is charged to half the supply voltage. This has the advantage that the reference cell capacitors can be identical to the memory cell capacitors, so that manufacturing process variations and temperature variations affect both types of cell equally. However, it has the disadvantage of relatively low speed because the restoration cycle and memory access cycles can not overlap in time, and the disadvantage of having to charge the bit lines which have a relatively large capacitance.

In another known manner of restoring the charge on the reference cell capacitors, each reference cell capacitor is formed with half the capacitance of the memory cell capacitors, and is discharged by a transistor connected in parallel with the reference cell capacitor to achieve the restoration. This provides the advantage of high speed of restoration, but the different sizes of memory and reference cell capacitors makes them undesirably sensitive to manufacturing process and temperature variations.

Neither of the above known schemes makes any allowance for the threshold voltage of the coupling transistor which is used in each cell for coupling the capacitor to a bit line of the RAM. This threshold voltage is important in that when a capacitor is discharged via its coupling transistor its voltage falls to this threshold voltage rather than to zero volts. In consequence, the reference voltage provided by each reference cell capacitor should be mid-way between this threshold voltage and the supply voltage, rather than being mid-way between zero volts and the supply voltage, in order to provide the best signal margin.

In order to discharge each capacitor fully, it is known to "bootstrap" the word lines of the RAM, which are connected to the gates of the coupling transistors, in that for the discharging operation each word line is taken to a level of zero volts minus the threshold voltage. Whilst this is feasible for NMOS RAMs, it is disadvantageous for CMOS RAMs because the need for bootstrapping considerably complicates the design of the RAM.

An object of this invention, therefore, is to provide an improved dynamic MOS memory including a reference voltage generator in which one or more of the above disadvantages are reduced or eliminated.

According to one aspect of this invention there is provided a reference voltage generator for a dynamic MOS memory including a reference cell comprising a storage capacitor, the generator comprising: first and second similar capacitors; means for charging the capacitors to different voltages; first coupling means for coupling the charged capacitors together to share their charges equally; buffer means; and second coupling means for coupling at least one of the capacitors via the buffer means to the storage capacitor of the reference cell of the dynamic RAM.

The buffer means conveniently comprises a unity-gain buffer amplifier.

The second coupling means preferably comprises a first transistor for selectively coupling said at least one of the capacitors to an input of the buffer means, and a second transistor for selectively coupling an output of the buffer means to a bit line of the dynamic MOS memory to which said reference cell is connected. In order to provide a balanced arrangement, preferably a transistor similar to the first transistor is coupled to the other one of the two capacitors to which the first capacitor is not directly coupled.

The means for charging the capacitors preferably comprises a first transistor for coupling the first capacitor to a supply voltage and a second transistor for simultaneously coupling the second capacitor to a predetermined voltage, such as a second supply voltage.

According to another aspect this invention provides a dynamic MOS memory comprising: a bit line having a plurality of cells connected thereto, each cell comprising an MOS transistor and a storage capacitor; and a reference voltage generator comprising: two capacitors of equal capacitance; means for charging said two capacitors to different voltages and subsequently coupling said two capacitors together to share their charges; buffer means; and means for coupling one of said two capacitors via the buffer means to said bit line.

The dynamic MOS memory is preferably a CMOS RAM.

Figure 2:
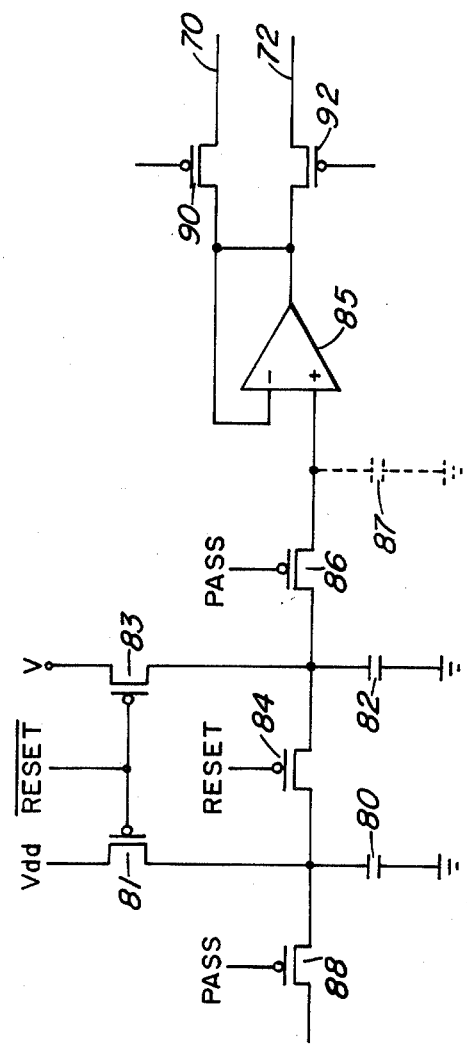

The invention will be further understood from the following description with reference to the accompanying drawings, in which:

FIG. 1 schematically illustrates in a simplified form parts of a dynamic RAM of known form; and FIG. 2 schematically illustrates a reference voltage generator for a dynamic RAM in accordance with this invention.

The following description assumes, for simplicity and purely by way of example, that the dynamic RAM referred to is a CMOS device with p-channel transistors and a 5 volt supply.

Referring to FIG. 1, part of one column of an open bit line dynamic RAM is shown, comprising bit lines 10 and 12 respectively which are coupled together via a sense amplifier 14 comprising two cross-connected transistors coupled to a latch node 16. Each bit line has associated with it a parasitic capacitance 18 which is shown in broken lines in FIG. 1. A plurality of word lines 20, only one of which is shown for the sake of clarity and simplicity, and a single reference word line 30, intersect the bit line 10 on one side of the sense amplifier 14, and a like plurality of word lines 22, only one of which is shown, and a single reference word line 32, intersect the bit line 12 on the other side of the sense amplifier 14.

At each intersection between the bit line 10 and the word lines 20 there is a one-bit memory cell 40, and at each intersection between the bit line 12 and the word lines 22 there is a similar memory cell 42. In addition, at the intersection between the bit line 10 and the reference word line 30 there is a reference cell 50, and at the intersection between the bit line 12 and the reference word line 32 there is a similar reference cell 52. Each memory or reference cell consists of a storage capacitor 60 and a coupling transistor 62 coupled in series between the respective bit line and a zero voltage level, shown in FIG. 1 as being a ground point, with a gate of the transistor 62 connected to the respective word line.

In the particular known arrangement shown in FIG. 1, the bit lines 10 and 12 are also coupled via a transistor 64 which is controlled by a signal supplied to its gate to couple the bit lines 10 and 12 together for charge sharing purposes as described below. In this case the capacitors of all of the cells 40, 42, 50, and 52 have the same capacitance. In an alternative known arrangement which is not illustrated but is mentioned above, the transistor 64 is omitted, the capacitors of the reference cells 50 and 52 each have half the capacitance of the capacitors of the memory cells 40 and 42, and a transistor is connected in parallel with each reference cell capacitor for discharging it.

For a read operation on the RAM shown in FIG. 1, the capacitors in the reference cells 50 and 52 are initially charged to half the supply voltage, or 2.5 volts, as described below. To read the bit from a memory cell, for example a cell 42, appropriate potentials are applied in known manner to the bit line 12 via its end 72 and to the respective word line 22 to cause the transistor of the cell 42 to conduct and the charge of the capacitor in the cell 42 to be shared with the charge of the capacitor 18 of the bit line 12. At the same time, appropriate potentials are applied to the bit line 10 via its end 70 and the reference word line 30 to cause the transistor of the reference cell 50 to conduct and the charge of the reference cell capacitor to be shared with that of the capacitance of the bit line 10. The sense amplifier 14 is then controlled via the latch node 16 to amplify regeneratively the resultant voltage difference of the bit lines 10 and 12, restoring the state of the capacitor in the memory cell 42 and enabling the bit to be determined from the voltage on the bit line 12, or the differential voltage between the bit lines 10 and 12. The capacitor in the reference cell 50 must then be restored to its original state of being charged to half the supply voltage.

To restore the state of the reference cell capacitors, initially one of the bit lines 10 and 12 is charged to the supply voltage while the other is discharged to zero volts. Then the transistor 64 is rendered conductive to share the charge between the bit lines 10 and 12, whereby each is charged to half the supply voltage. As the transistors in the reference cells 50 and 52 are conductive at this time the reference cell capacitors are each charged to half the supply voltage. In this respect it is observed that the capacitance 18 of each bit line is much greater than that of the reference cell capacitors, for example about 1 pF for the former and about 0.1 pF for the latter. As the whole of this restoration makes use of both of the bit lines 10 and 12, this cannot be overlapped in time with memory access operations which also require the use of the bit lines.

Referring now to FIG. 2, there is illustrated a preferred form of reference voltage generator in accordance with an embodiment of the invention. This is intended for use in a dynamic RAM having the same arrangement as that described with reference to FIG. 1 except for the transistor 64, which is omitted.

The generator of FIG. 2 includes two capacitors 80 and 82 of similar design and capacitance to those of all of the memory and reference cell capacitors 60 in the dynamic RAM. The capacitor 80 is coupled in series with a transistor 81 between zero volts (ground) and the supply voltage Vdd, while the capacitor 82 is similarly coupled in series with a transistor 83 between zero volts and a voltage V. The capacitors 80 and 82 are also coupled together by a transistor 84 which is controlled by a signal RESET, the complement of which signal controls the transistors 81 and 83.

One of the capacitors, 82 as shown, is coupled to the non-inverting input of a unity-gain buffer amplifier 85 via a transistor 86 controlled by a signal PASS. The transistor 86 is provided to isolate the capacitor 82 from the stray capacitance 87, shown in broken lines in FIG. 2, of the amplifier 85 and to reduce power consumption, but can conceivably be omitted. In order to provide a balanced arrangement, an optional transistor 88 also controlled by the signal PASS is connected to the other capacitor 80, with one electrode floating. The output of the amplifier 85 is connected via respective transistors 90 and 92 to the ends 70 and 72 respectively of the bit lines of the dynamic RAM. The reference voltage generator may be associated with only one column of the dynamic RAM in this manner, as many generators being provided as there are columns of the RAM, or conceivably a single generator may be associated in a similar manner with a plurality of, or all, columns of the RAM.

In operation of the reference voltage generator, the voltage V is normally zero volts or ground. With the signal PASS high so that the transistor 86 is non-conducting, the signal RESET is initially high so that the transistors 81 and 83 conduct, whereby the capacitor 80 is charged to the supply voltage and the capacitor 82 is discharged to a voltage not less than $V_t$, where Vt is the threshold voltage of the transistor 83. As all of the transistors are constructed similarly, this is also the threshold voltage of the transistors in the RAM cells. When V is zero as is normally the case, the capacitor 82 is discharged to Vt. The voltages of the capacitors 80 and 82 thus correspond accurately to the binary 0 and 1 state voltages of the memory cells, allowing for the threshold voltage Vt without the need for bootstrapping.

The signal RESET then goes low so that the transistors 81 and 83 cease to conduct and the transistor 84 conducts, whereby the charges of the capacitors 80 and 82 are shared equally between them, each then being charged to the optimum reference voltage level of (Vdd +Vt)/2. The signal PASS subsequently goes low so that the transistor 86 (and also the transistor 88) conducts so that this reference voltage level is passed to the output of the buffer amplifier 85.

It should be appreciated that the above operations are completely independent of memory accesses, and accordingly can be carried out simultaneously with memory access operations, the transistors 90 and 92 being controlled via their gates to be non-conductive.

In order to restore the reference cell capacitor charges after a read operation as described above, the transistors 90 and 92 are controlled to be conductive while the transistors of the reference cells 50 and 52 are controlled via the reference word lines 30 and 32 also to be conductive, whereby the charge on the reference cell capacitors is restored to the voltage (Vdd +Vt)/2 which is best for signal margin purposes. As this restoration does not involve charge sharing between the bit lines 10 and 12, the restoration process takes less time overall than the restoration process of the prior art.

The transistors 90 and 92 can be commonly controlled or, especially when the bit lines can be isolated from the sense amplifier by isolating transistors, which are not shown in the drawings but which can be provided in known manner, the transistors 90 and 92 can be individually controlled so that for each restoration only that one of them, which is connected to the bit line to which the reference cell requiring restoration is connected, is rendered conductive. This restoration may then be overlapped in time with the final part of the reading of a bit from the other bit line of the column, providing for further increased operating speed.

Although the voltage V is as described above normally zero volts, this need not always be the case. In particular, this voltage may be varied in order to provide modified signal margin characterictics for the dynamic RAM, and/or to access the performance of the RAM under different signal margin conditions. Thus this embodiment of the invention provides a qualitative test facility in addition to providing the desirable characteristics of allowance for transistor thresholds and variation thereof, insensitivity to manufacturing process, temperature, and other (e.g. supply voltage) variations due to the use of similar capacitors and transistors throughout, and enhanced operating speed.

Although the embodiment of the invention described above relates to p-channel transistors in a CMOS device, the invention is also applicable to n-channel transistors and NMOS devices. In addition, although the above description relates specifically to RAMs, the invention is applicable to dynamic MOS memories generally. In addition, although the above description relates to an open bit line dynamic RAM, the invention is equally applicable to folded bit line dynamic RAMs.

Numerous other modifications, variations, and adaptation may be made to the particular embodiment of the invention described above without departing from the scope of the invention as defined in the claims.

What is claimed is:

1. A reference voltage generator for a dynamic MOS memory including a reference cell comprising a storage capacitor, the generator comprising:
   first and second similar capacitors;
   means for charging the capacitors to different voltages;
   first coupling means for coupling the charged capacitors together to share their charges equally;
   buffer means; and
   second coupling means for coupling at least one of the capacitors via the buffer means to the storage capacitor of the reference cell of the dynamic RAM.

2. A reference voltage generator as claimed in claim 1 wherein the buffer means comprises a unity-gain buffer amplifier.

3. A reference voltage generator as claimed in claim 1 wherein the second coupling means comprises a first transistor for selectively coupling said at least one of the capacitors to an input of the buffer means.

4. A reference voltage generator as claimed in claim 3 wherein the second coupling means comprises a second transistor for selectively coupling an output of the buffer means to a bit line of the dynamic MOS memory to which said reference cell is connected.

5. A reference voltage generator as claimed in claim 3 wherein the first transistor is coupled to one of the capacitors and including a transistor similar to the first transistor coupled to the other of the capacitors.

6. A reference voltage generator as claimed in claim 1 wherein the means for charging the capacitors to different voltages comprises a first transistor for coupling the first capacitor to a supply voltage, and a second transistor for simultaneously coupling the second capacitor to a predetermined voltage.

7. A reference voltage generator as claimed in claim 1 wherein the means for charging the capacitors to different voltages comprises first and second transistors for coupling the first and second capacitors to respective supply voltages.

8. A dynamic MOS memory comprising:
   a bit line having a plurality of cells connected thereto, each cell comprising an MOS transistor and a storage capacitor; and
   a reference voltage generator comprising:
   two capacitors of equal capacitance;
   means for charging said two capacitors to different voltages and subsequently coupling said two capacitors together to share their charges;
   buffer means; and
   means for coupling one of said two capacitors via the buffer means to said bit line.

9. A dynamic MOS memory as claimed in claim 8 wherein the buffer means comprises a unity-gain buffer amplifier.

10. A dynamic MOS memory as claimed in claim 8 wherein the means for coupling comprises first and second transistors for respectively selectively coupling said one of the capacitors to an input of the buffer means and the output of the buffer means to said bit line.

11. A dynamic MOS memory as claimed in claim 10 and including a transistor similar to the first transistor coupled to the other of said two capacitors.

12. A dynamic MOS memory as claimed in claim 8 wherein the means for charging comprises two transistors for selectively coupling said two capacitors to respective supply voltages.

13. A dynamic MOS memory as claimed in claim 8 wherein the memory is a RAM.

14. A dynamic MOS memory as claimed in claim 8 wherein the memory is a CMOS RAM.

* * * * *